United States Patent
Matsui et al.

(10) Patent No.: US 11,462,416 B2
(45) Date of Patent: Oct. 4, 2022

(54) PLASMA PROCESSING METHOD AND PLASMA PROCESSING APPARATUS

(71) Applicant: Hitachi High-Tech Corporation, Tokyo (JP)

(72) Inventors: Miyako Matsui, Tokyo (JP); Kenichi Kuwahara, Tokyo (JP); Tatehito Usui, Tokyo (JP); Hiroyuki Kobayashi, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/957,347

(22) PCT Filed: Dec. 17, 2019

(86) PCT No.: PCT/JP2019/049420
§ 371 (c)(1),
(2) Date: Jun. 23, 2020

(87) PCT Pub. No.: WO2020/122259
PCT Pub. Date: Jun. 18, 2020

(65) Prior Publication Data
US 2020/0335354 A1    Oct. 22, 2020

(30) Foreign Application Priority Data
Feb. 4, 2019 (WO) .............. PCT/JP2019/003817

(51) Int. Cl.
*H01L 21/311* (2006.01)
*H01J 37/32* (2006.01)

(52) U.S. Cl.
CPC .. *H01L 21/31116* (2013.01); *H01J 37/32174* (2013.01); *H01J 37/32926* (2013.01); *H01L 21/31144* (2013.01); *H01J 2237/3341* (2013.01)

(58) Field of Classification Search
CPC ......... H01J 2237/3341; H01J 37/32174; H01J 37/32926; H01L 21/31116; H01L 21/31144; H01L 22/12; H01L 22/26
(Continued)

(56) References Cited

U.S. PATENT DOCUMENTS

| 5,352,324 A | 10/1994 | Gotoh et al. |
| 6,355,581 B1 | 3/2002 | Vassiliev |

(Continued)

FOREIGN PATENT DOCUMENTS

| JP | H11-111699 A | 4/1999 |
| JP | 2003083720 A | 3/2003 |

(Continued)

OTHER PUBLICATIONS

Dominik Metzler et al "Fluorocarbon assisted atomic layer etching of SiO2 using cyclic Ar/C4F8 plasma" Journal of Vacuum Science & Technology, A32, Mar. 2014 (5 pages).

(Continued)

*Primary Examiner* — Lan Vinh
(74) *Attorney, Agent, or Firm* — Miles & Stockbridge, P.C.

(57) ABSTRACT

Provided is a plasma processing method for plasma etching an etching target film formed on a sample. The method includes a protective film forming step of selectively forming a protective film on an upper portion of a pattern formed on the sample and adjusting a width of the formed protective film such that a distribution of the width of the formed protective film in a surface of the sample becomes a desired distribution, and a step of plasma etching the etching target film after the protective film forming step.

9 Claims, 9 Drawing Sheets

(A) PROTECTIVE FILM FORMING STEP        (B) PROTECTIVE FILM PARTIALLY REMOVING STEP

(58) Field of Classification Search
USPC ....... 438/706, 710, 712, 717, 719, 723, 725, 438/736, 758; 156/345.24, 345.26, 156/345.15
See application file for complete search history.

(56) References Cited

U.S. PATENT DOCUMENTS

| | | | |
|---|---|---|---|
| 8,124,537 B2* | 2/2012 | Lee | H01L 21/31144 438/710 |
| 9,530,666 B2 | 12/2016 | Mizuno et al. | |
| 2007/0026677 A1 | 2/2007 | Ji et al. | |
| 2007/0238305 A1* | 10/2007 | Delgadino | H01L 21/0209 438/710 |
| 2008/0020584 A1 | 1/2008 | Hirotsu et al. | |
| 2011/0139748 A1 | 6/2011 | Donnelly et al. | |
| 2013/0023125 A1 | 1/2013 | Singh | |
| 2015/0235861 A1 | 8/2015 | Mizuno et al. | |
| 2016/0099187 A1* | 4/2016 | Lian | H01L 21/0273 438/8 |
| 2016/0379841 A1 | 12/2016 | Hidaka et al. | |
| 2018/0233350 A1 | 8/2018 | Tois et al. | |
| 2018/0269118 A1 | 9/2018 | Matsui et al. | |
| 2019/0019689 A1 | 1/2019 | Kihara et al. | |

FOREIGN PATENT DOCUMENTS

| | | |
|---|---|---|
| JP | 2005294348 A | 10/2005 |
| JP | 2007258586 A | 10/2007 |
| JP | 2008-060566 A | 3/2008 |
| JP | 2012529777 A | 11/2012 |
| JP | 2014-232825 A | 12/2014 |
| JP | 201711167 A | 1/2017 |
| JP | 2017-212331 A | 11/2017 |
| JP | 2017212331 A | 11/2017 |
| JP | 2018137435 A | 8/2018 |
| JP | 2018-157048 A | 10/2018 |
| KR | 20170000791 A | 1/2017 |
| WO | 2014046083 A1 | 3/2014 |

OTHER PUBLICATIONS

Search Report dated Mar. 10, 2020 in corresponding International Application No. PCT/JP2019/049420.
Search Report dated Mar. 9, 2021 in International Application No. PCT/JP2021/046976.

* cited by examiner

[FIG. 1]
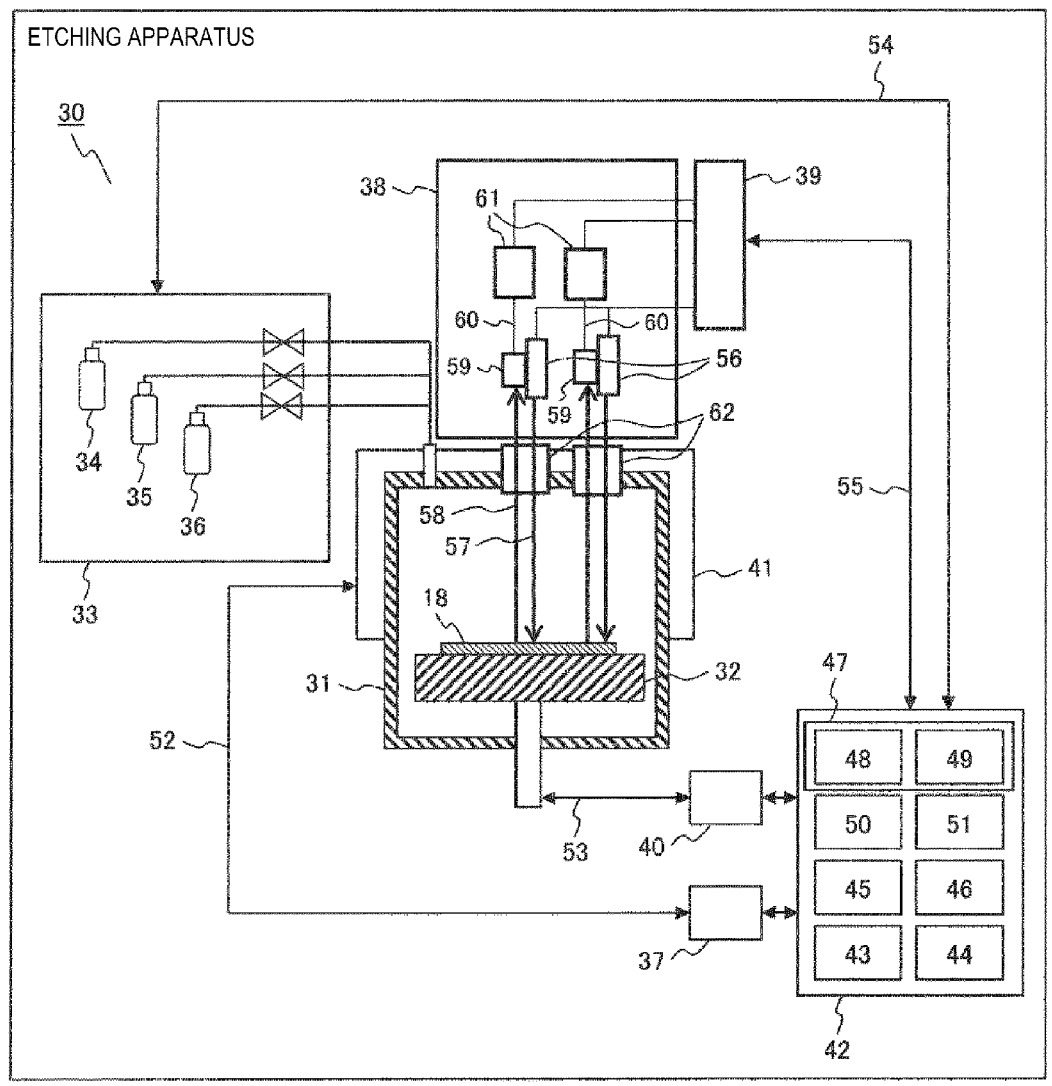
[FIG. 2]
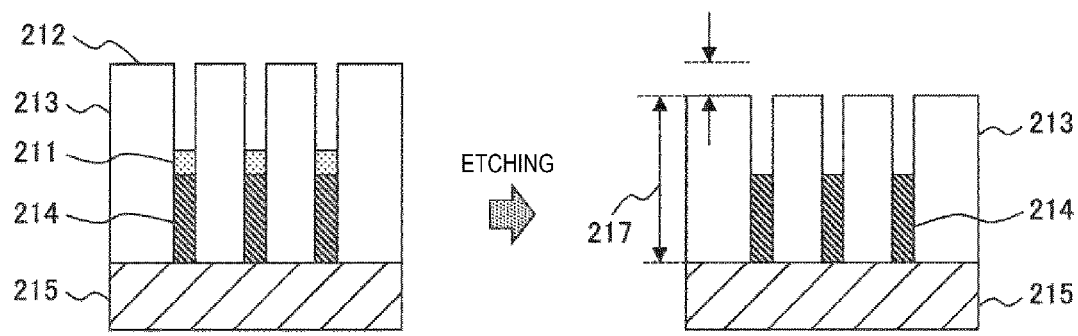

[FIG. 3]
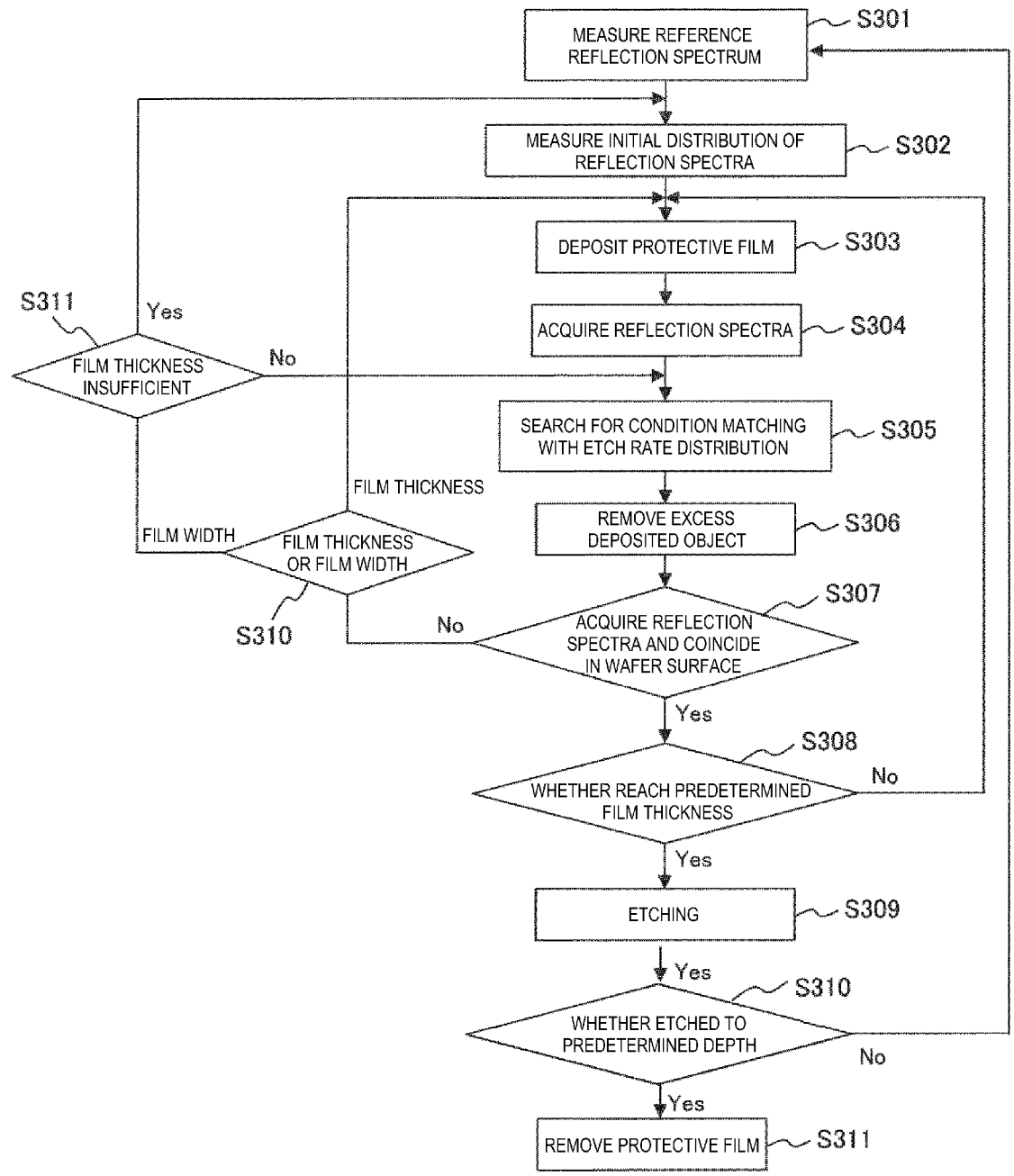

[FIG. 4]
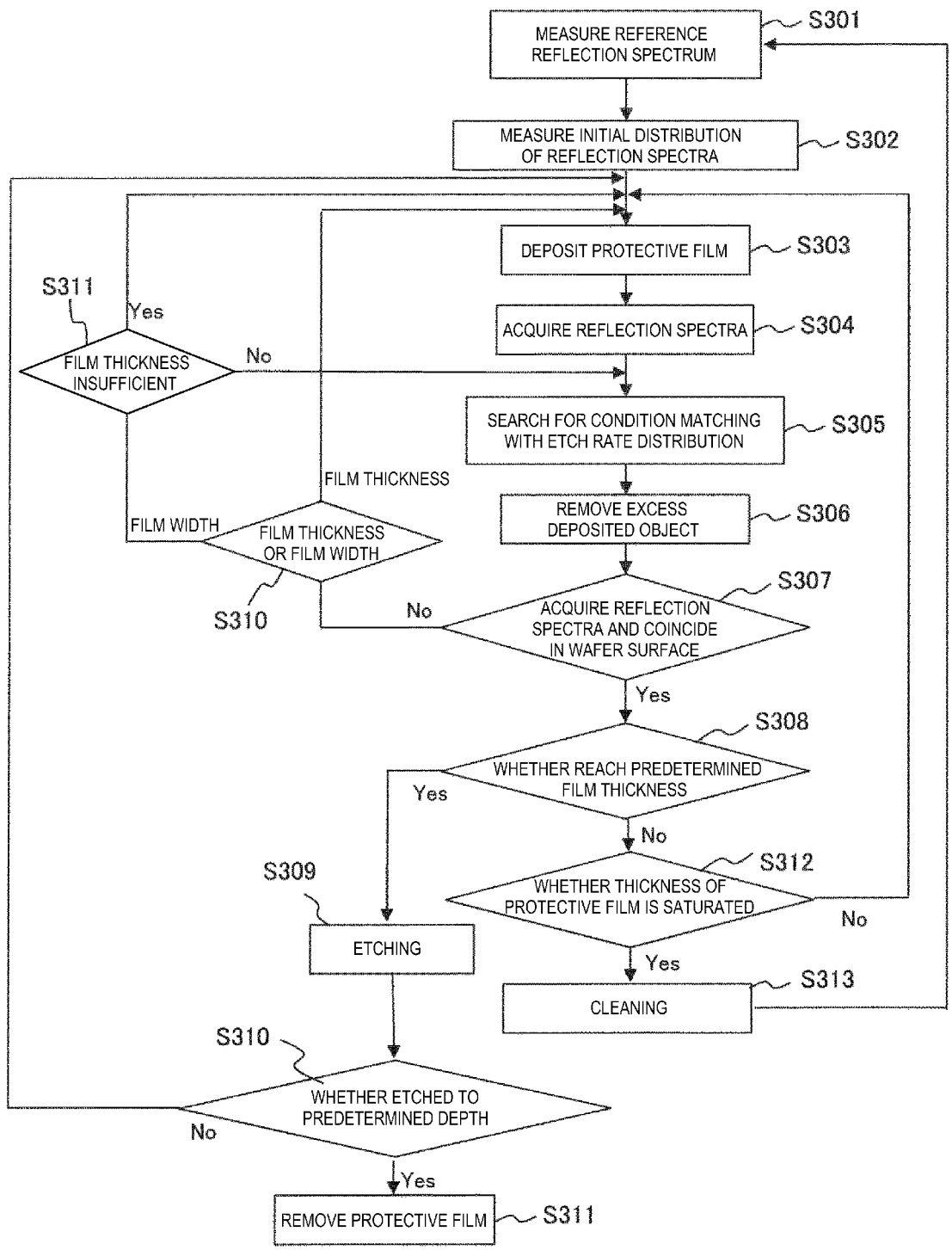

(A) REFLECTED SPECTRA MEASUREMENT POSITIONS (B) PROTECTIVE FILM DEPOSITION STEP (C) EXCESS DEPOSITED OBJECT REMOVING STEP (D) AFTER EXCESS DEPOSITED OBJECT REMOVING STEP

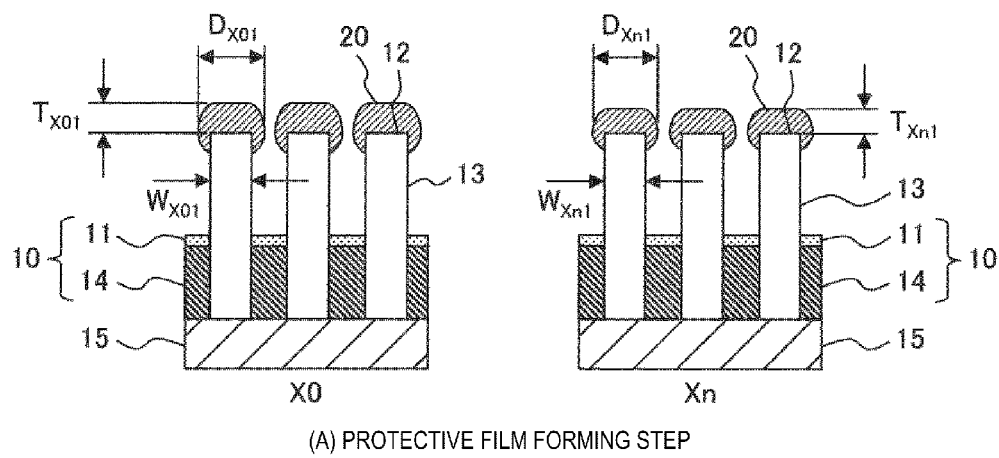
(A) PROTECTIVE FILM FORMING STEP
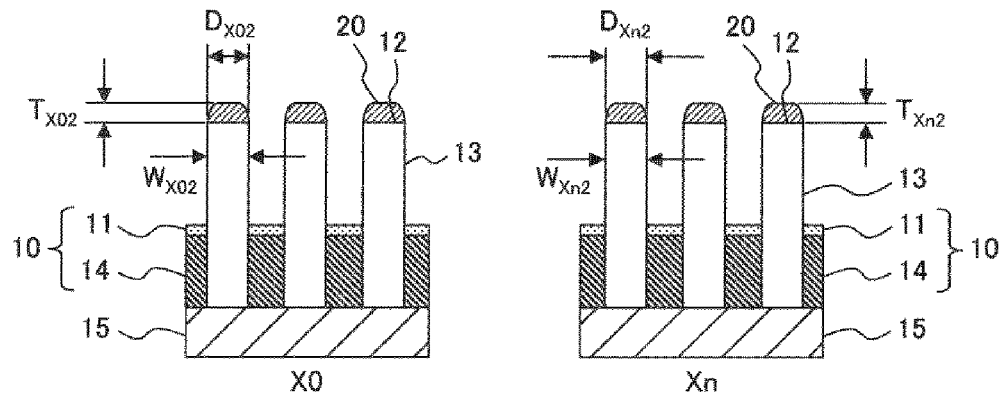
(B) PROTECTIVE FILM PARTIALLY REMOVING STEP (a) IN CASE WHERE THICKNESS OF PROTECTIVE FILM ON PATTERN CHANGES (b) IN CASE WHERE PROTECTIVE FILM IS DEPOSITED IN LATERAL DIRECTION (A) EXAMPLE OF FILM THICKNESS DISTRIBUTION CONTROL DATABASE (B) EXAMPLE OF PATTERN SIZE CONTROL DATABASE

[FIG. 9]
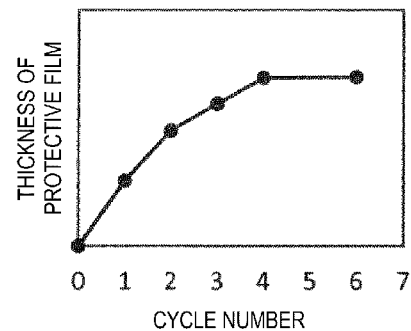
[FIG. 10]
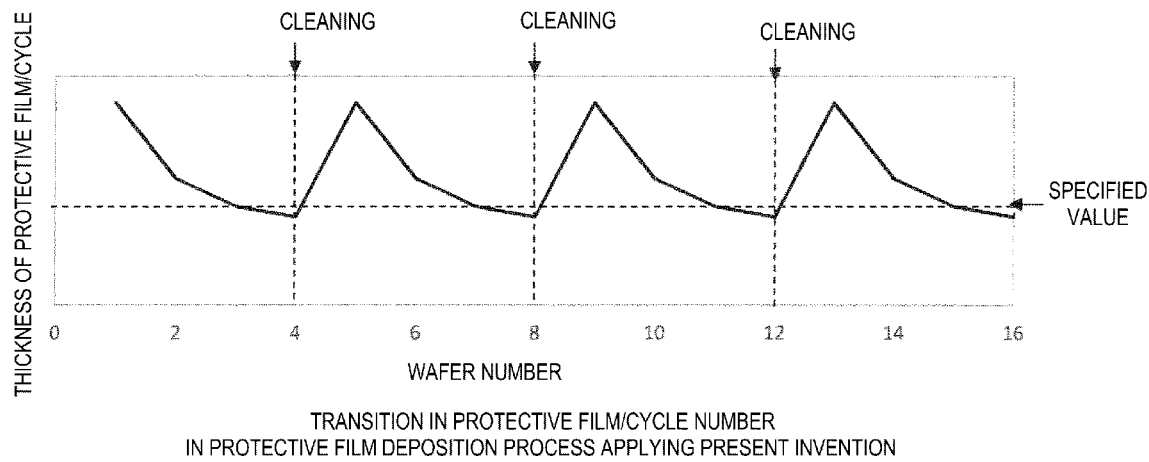
TRANSITION IN PROTECTIVE FILM/CYCLE NUMBER
IN PROTECTIVE FILM DEPOSITION PROCESS APPLYING PRESENT INVENTION
[FIG. 11]
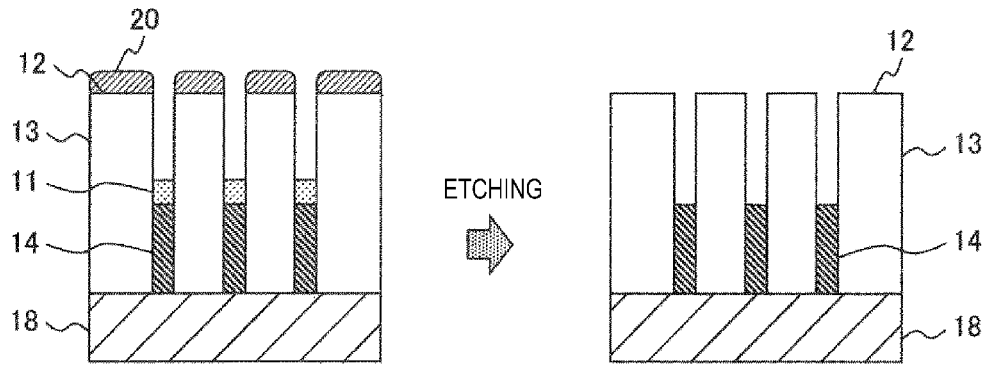

PLASMA PROCESSING METHOD AND PLASMA PROCESSING APPARATUS

TECHNICAL FIELD

The present invention relates to a plasma processing method and a plasma processing apparatus, and particularly relates to a plasma processing apparatus and a plasma processing method including a step of forming a desired etching protection film on an upper surface of a pattern on a wafer.

BACKGROUND ART

A development of three-dimensional device processing techniques using multi-patterning that uses a sidewall of a thin film spacer as a mask has been accelerated due to miniaturization of functional element products such as a semiconductor element. Accordingly, a technique of processing a groove or a hole using various materials such as the thin film spacer or a metal as the mask is important in a processing step of the semiconductor element such as a three-dimensional device or the like.

The thickness of the mask, a gate insulating film, an etching stopper, or the like is reduced, and a processing technique for controlling a shape at an atomic layer level is required. Further, as a device is three-dimensionally formed, a step of processing a complex shape is increasing, such as simultaneously processing patterns formed on layers having different depths from a wafer surface or processing a pattern whose opening size varies depending on depth.

As an example, FIG. 2 shows a case in a related art of processing a material at a lower layer without a mask pattern. For example, when an etching target layer 211 at a lower layer in a groove pattern 213 is etched in a pattern without a mask as shown in FIG. 2, an upper surface 212 of the groove pattern 213 may be etched and a depth of the groove pattern 213 may be reduced (the groove pattern 213 is lowered).

Alternatively, even in a case where there is a mask in an upper layer of the upper surface 212 of the groove pattern 213, a mask pattern may be etched during the etching of the etching target layer 211 at the lower layer in the groove pattern 213 when the thickness of the mask pattern is small, and the etching proceeds to the upper surface 212 of the groove pattern 213.

On the other hand, as a related art for etching of forming a deposit film on a pattern, PTL 1 discloses a method of controlling an etching parameter so that a thickness of a deposition (hereinafter referred to as deposit) film on a mask during etching is within an allowable value by using a mixed gas having a high deposition property such as a fluorocarbon gas or a hydrofluorocarbon gas as a technique for etching. In the method, since etching of a lower layer is implemented simultaneously with a formation of the deposit film on the mask, it is necessary to proceed the etching on a lower layer surface simultaneously with a formation of a thick deposit film on the mask to prevent etching.

Next, a method is known in Non-Patent Literature 1 in which etching with a depth accuracy of the atomic layer level is achieved by repeating a step of forming a deposit film having reactivity with an etching target material on the etching target material and a step of removing a reaction product by ion irradiation or the like.

PTL 2 discloses a technique of implementing etching after a deposit film is formed on a mask pattern in order to adjust a variation in a groove width of the mask pattern. In the method, by using a fact that a deposit rate of the deposit film depends on wafer temperature, a deposit film having a thickness corresponding to the variation in the groove width is formed, and the groove width is adjusted to be uniform in a wafer surface.

CITATION LIST

Patent Literature

PTL 1: JP-A-2014-232825
PTL 2: JP-A-2017-212331

Non-Patent Literature

Non-Patent Literature 1: Journal of Vacuum Science & Technology A32, 020603 (2014)

SUMMARY OF INVENTION

Technical Problem

As described above, it is important to etch a structure having a fine high aspect ratio along with miniaturization and complexity of a pattern in a three-dimensional device. For example, it is difficult to etch the etching target layer 211 at the lower layer in the maskless groove pattern 213 as shown in FIG. 2 without damaging the groove pattern by the method of the related art.

In the case where the mask is formed on an upper layer of a pattern but the mask is thin and the etching of the upper surface of the pattern cannot be prevented, or in a case where a material of the etching target layer 211 at the lower layer and a material of the mask are similar materials, the upper surface 212 of the pattern may be etched by penetrating through the thin mask during etching of the etching target layer 211 at the lower layer and a desired pattern shape may not be obtained.

Here, as an example in the case where the material of the etching target layer 211 at the lower layer and the material of the mask are similar materials, a SiO based composition material contains C based materials such as organic substances and materials containing H, N, B, P, or the like. Alternatively, an organic material containing C or the like contains C based materials such as other organic substances and materials containing H, N, B, P, or the like.

First, in PTL 1, a deposit film is formed on a mask and the lower layer is simultaneously etched, and the thickness of the deposit film is measured by a film thickness measuring device and an etching condition is controlled so that the deposit film on the mask has a desired thickness. For the reason, while forming the deposit film on the mask and ensuring a deposit film thickness, it is necessary to control plasma so that the etching of the lower layer proceeds and to obtain a desired shape.

However, for example, in the case of processing a pattern structure having a high aspect ratio, it may be difficult to balance plasma radical irradiation and ion irradiation such that etching of the lower layer proceeds while simultaneously forming the deposit film for protecting the mask.

Although it is necessary to increase ion energy emitted from the plasma to etch the lower layer in the groove pattern when the aspect ratio of the pattern is high, it is necessary to thicken the deposit film on the mask in order to prevent etching of the mask since the plasma etching proceeds when the ion energy is increased. When the deposit film on the mask is thickened, a deposit film on a sidewall and a bottom of the pattern also increases, and thus the desired pattern shape may not be obtained.

In the case of the maskless pattern, it is difficult to prevent etching of the upper surface of the pattern and etch only the lower layer when the upper surface and the lower layer of the pattern are similar or identical in material.

Next, in the method of repeating the step of sticking a reaction layer having reactivity with the etching target material and a step of removing a reaction product by ion irradiation or the like as described in Non-Patent Literature 1, it is difficult to prevent etching of the mask while ensuring the ion energy and ion flux for etching the lower layer when the aspect ratio is high, since sticking on the mask, sticking on the etching target material at the lower layer, ion irradiation on the lower layer and ion irradiation on the mask are performed simultaneously although plasma conditions in the sticking step and conditions of ion energy and the like in the removing step can be controlled separately.

In the case of the maskless pattern, it is difficult to prevent etching of the upper surface of the pattern and etch only the lower layer when the upper surface and the lower layer of the pattern are similar or identical in material.

PTL 2 discloses a method of forming a deposit film on a mask pattern before etching as a method of preventing a variation in a minimum line width of a pattern. A deposit film having a thickness for correcting the variation in the groove width is formed and the groove width is adjusted in the wafer surface by changing wafer temperature in each region to correct a variation in a pattern size measured in advance, by using the fact that the deposit rate of the deposit film depends on the wafer temperature. However, since the method adjusts the groove width by forming a thin deposit film conformally on the mask pattern, it is not possible to form a deposit film with a thickness that is sufficient to prevent the etching of the upper surface of the pattern only on the upper surface of the fine pattern.

An object of the invention is to solve the above-described problems of the related art and provide a plasma processing method and a plasma processing apparatus in which, in a maskless pattern having a complex structure such as a high aspect ratio, a protective film with uniform thickness and pattern width in a wafer surface can be formed with high reproducibility on an upper surface of the pattern before etching, so as to implement etching of an etching target pattern at a lower layer without etching the upper surface of the pattern, and to obtain a uniform pattern shape in the wafer surface.

Solution to Problem

To solve the problems of the related art described above, the invention relates to a plasma processing method for plasma etching an etching target film formed on a sample. The method includes a protective film forming step of selectively forming a protective film on an upper portion of a pattern formed on the sample and adjusting a width of the formed protective film such that a distribution of the width of the formed protective film in a surface of the sample becomes a desired distribution, and a step of plasma etching the etching target film after the protective film forming step.

To solve the problems of the related art described above, the invention relates to a plasma processing apparatus including a processing chamber where an etching target film formed on a sample is plasma etched using mask, a radio frequency power supply that supplies radio frequency power for generating the plasma, a sample stage on which the sample is placed, and a control unit that executes a protective film forming step of selectively forming a protective film on an upper portion of a pattern formed on the sample and adjusting a width of the formed protective film such that a distribution of the width of the formed protective film in a surface of the sample becomes a desired distribution, and a step of plasma etching the etching target film after the protective film forming step.

To solve the problems of the related art described above, the invention relates to a plasma processing apparatus including a processing chamber where an etching target film formed on a sample is plasma etched using mask, a radio frequency power supply that supplies radio frequency power for generating the plasma, a sample stage on which the sample is placed, and a control unit that executes a protective film forming step of selectively forming a protective film on an upper portion of a pattern formed on the sample and adjusting a thickness of the formed protective film such that a distribution of the thickness of the formed protective film in a surface of the sample becomes a desired distribution, and a step of plasma etching the etching target film after the protective film forming step.

Advantageous Effect

According to the invention, a protective film with uniform thickness and pattern width in a wafer surface can be formed with high reproducibility on the upper surface of the pattern before etching, and a fine pattern can be etched with high accuracy and high reproducibility.

BRIEF DESCRIPTION OF DRAWINGS

FIG. 1 shows an example of a plasma processing apparatus of the invention.

FIG. 2 is a schematic view for describing a problem of a method in a related art.

FIG. 3 is a diagram showing an example of a process flow of a protective film forming method according to an embodiment.

FIG. 4 is a diagram showing another example of the process flow of the protective film forming method according to the embodiment.

FIGS. 6(A) and 6(B) are explanatory diagrams of uniforming the wafer surface of the protective film forming method according to the embodiment.

FIG. 9 shows an example of changes per cycle of thickness of the protective film.

FIG. 10 is an example of a transition in the thickness of the protective film deposited per cycle according to the embodiment.

FIG. 11 is a cross-sectional view of a pattern after plasma processing according to the embodiment.

DESCRIPTION OF EMBODIMENTS

Figure 5A:
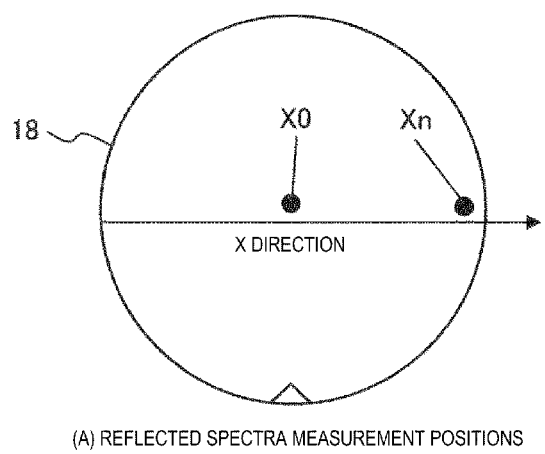
FIGS. 5(A) to 5(D) are explanatory diagrams of uniforming a wafer surface of the protective film forming method according to the embodiment.

In the case of the maskless pattern or in the case where the mask is thin as shown in FIG. 2, the present inventors have considered that if a protective film can be formed on the upper surface 212 of the pattern, the etching target material at the lower layer can be processed without etching the upper surface 212 of the pattern even in the maskless pattern. In a case where a pattern having a high aspect ratio is processed, it is considered that a desired shape can be obtained without etching the upper surface of the pattern by forming a protective film on the upper surface of the mask.

However, as a method of forming a deposit film on the upper surface of the pattern before etching, following problems are apparent.

First, when a deposit film is formed only on the upper surface of the pattern, it is a problem to form the protective film uniformly in the wafer surface. For example, a distribution may occur in a thickness of the protective film in the wafer surface when plasma is generated in an etching chamber to form the protective film. In the case where the thickness of the protective film is distributed, although the etching of the upper surface of the pattern can be prevented in the etching step, the pattern shape after the etching changes depending on the thickness and shape of the protective film, causing a problem of a distribution in the wafer surface.

In a case where the protective film is formed on the upper surface of the pattern and is also formed in a lateral direction of the pattern, a size of the pattern width may vary within the wafer surface. When the distribution occurs in the size of the pattern width of the protective film, the pattern shape after the etching may have a distribution in the wafer surface.

When plasma with deposition property is generated, a surface state of an inner wall of the etching chamber changes with time, atmosphere in the etching chamber changes with time, and a process of forming the protective film and the reproducibility of the etching process are deteriorated.

It is an object of the invention to solve the problems described above. The invention relates to a protective film forming method capable of forming a uniform protective film on an upper surface of a pattern having a complex structure such as a high aspect ratio pattern and a maskless pattern without being deposited on a groove bottom of the pattern before etching, and provides a protective film forming method including a protective film deposition step of forming a protective film on an upper surface of a pattern and an excess deposited object removing step of removing an excess deposited object generated in the protective film deposition step to allow uniform in the surface.

The protective film deposition step is performed using a high dissociation plasma of a deposition gas, and the excess deposited object removing step is performed using reactive ion assist.

In the excess deposited object removing step, light is emitted to at least two locations in the wafer surface to acquire respective reflection spectra, and the acquired reflection spectra are matched to determine the uniformity of the protective film in the wafer surface.

When in the excessive deposit removal, a database for correcting non-uniformity of the protective film is provided, and a deposit removal condition for correcting the non-uniformity of the protective film is determined.

Further, in the invention, a plasma processing apparatus includes a processing vessel for plasma processing of a wafer in a reduced-pressure atmosphere, a first gas supply device for supplying a gas for forming a protective film into a processing chamber, a second gas supply device for supplying a gas capable of removing a protective film into the processing chamber, a third gas supply device for supplying an etching gas into the processing chamber, a plasma generating device for converting the gas supplied into the processing chamber into plasma, a switching device for switching the first to third gas supply devices, a light emitting spectrum device that emits light to at least two locations in the wafer surface and acquires the respective reflection spectra, and a determination device that matches the acquired reflection spectra to determine the uniformity of the protective film in the wafer surface.

A bias applying device that has a database for correcting non-uniformity in the surface of the protective film and generates reactive ion assist for correcting the non-uniformity of the protective film when removing the excess deposited object is also provided.

When the film thickness of the etching target material is large, the protective film deposited in the protective film deposition step and the excess deposited object removing step are used as a mask, and a step of processing the etching target material is performed cyclically. Even if cyclic processing is implemented, a step of cleaning an inside of the chamber is implemented in a case where a deposit film having a desired film thickness cannot be formed.

When the protective film forming step and the excess deposited object removing step are performed in a cyclic manner, it is determined by matching the reflection spectra that the deposited thickness of the protective film is equal to or more than a certain value, and the step of cleaning the inside of the processing chamber is implemented in a case where the deposited thickness of the protective film is equal to or less than the certain value.

Hereinafter, an embodiment of the invention will be described in detail with reference to the drawings. In all the drawings, those having the same function are denoted by the same reference numeral and repeated description thereof is omitted.

Embodiment

In an etching apparatus according to the present embodiment, a protective film is deposited on a surface of a fine pattern (groove pattern) formed on a wafer, an excess deposited object is removed from the deposited protective film to form a uniform protective film in the wafer surface, and the etching target material at the lower layer in the groove pattern is etched and removed.

FIG. 1 shows an overall configuration of an example of a plasma processing apparatus of the embodiment. An etching apparatus 30, which is a plasma processing apparatus, includes a processing chamber 31, a wafer stage 32, a gas supply unit 33, an optical system 38, an optical system control unit 39, a bias power supply 40, a radio frequency application unit 41, an apparatus control unit 42, and the like.

The apparatus control unit 42 includes functional blocks such as a gas control unit 43, an exhaust system control unit 44, a radio frequency control unit 45, a bias control unit 46, a film thickness control unit 47, a storage unit 50, and a clock 51. The functional blocks constituting the apparatus control unit 42 can be achieved by one personal computer (PC).

The film thickness control unit 47 includes a film thickness calculation unit 48 and a database 49, and can calculate the film thickness by the film thickness calculation unit 48 by referring to a signal transmitted from the optical system control unit 39 to the database 49. In the embodiment, the film thickness control unit 47 and the apparatus control unit 42 may be collectively referred to simply as the control unit 42.

The etching apparatus 30 includes the wafer stage 32 provided in the processing chamber 31 and the gas supply unit 33 including gas cylinders and valves. A protective film forming gas 34, an excess deposited object removing gas 35 for removing an excessively formed film within a film serving as the protective film, and an etching gas 36 are supplied to the processing chamber 31 respectively in accordance with a processing step based on a control signal 54 from the apparatus control unit 42.

A processing gas supplied to the processing chamber 31 is decomposed into plasma in the processing chamber 31 by radio frequency power 52 applied from a radio frequency power supply 37 controlled by the apparatus control unit 42 to the radio frequency application unit 41. Further, pressure in the processing chamber 31 can be kept constant in a state in which the processing gas having a desired flow rate is allowed to flow by a variable conductance valve and a vacuum pump (not shown) connected to the processing chamber 31.

The optical system 38 acquires film thickness information of a protective film 20 deposited on the wafer 18. The optical system 38 can acquire distribution in the wafer surface of a cross-sectional shape (film thickness) of the protective film 20 by acquiring light spectrum emitted from the optical system 38 and reflected by the wafer 18.

For acquiring distribution-in-wafer-surface information of the cross-sectional shape (film thickness) of the protective film 20, first, the wafer 18 on which a reference groove pattern is patterned in which the protective film 20 is formed into a desired shape as reference data is introduced into the processing chamber 31. Information on the shape of the protective film 20 is stored in advance as the wafer information in the database 49 or the storage unit 50 of the apparatus control unit 42.

Next, in the optical system 38, incident light 57 emitted from light sources 56 is emitted onto the reference groove pattern on the wafer 18. As the light sources 56, for example, light in a wavelength range of 190 nm to 900 nm is used. Reflected light (interference light) 58 reflected by the reference pattern is detected by detectors 59, moved through optical fibers 60, dispersed by spectroscopes 61 and transmitted to the optical system control unit 39 as reflection spectra.

Reflection spectrum information transmitted to the optical system control unit 39 is transmitted to the film thickness control unit 47 as reference data, and is stored as the database 49 in advance.

First, as an example of an etching method of the present embodiment, a method of forming a uniform protective film in a wafer surface by implementing a protective film deposition step and an excess deposited object removing step will be described.

FIG. 3 is a diagram showing an example of a process flow of the protective film forming method according to the present embodiment. FIGS. 5(A) to 5(D), 6(A) and 6(B) are explanatory diagrams of a method of uniforming the protective film in the wafer surface in the protective film forming method of the present embodiment.

In the present embodiment, a case where a protective film is formed on a maskless pattern and is etched will be described as an example of an etching target pattern 10. In the etching target pattern 10, a non-etching layer 14 at a lower layer and an etching target layer 11 at the lower layer in a groove pattern 13 are formed on an underlayer 15 which is formed on the wafer 18 as a substrate, and no mask is formed on an upper surface 12 of the groove pattern 13. In order to etch only the etching target layer 11 at the lower layer of the etching target pattern 10, a method of forming the uniform protective film 20 on the upper surface 12 of the groove pattern 13 in the surface of the wafer 18 will be described based on the flowchart of FIG. 3.

In the embodiment, in order to determine the uniformity in the wafer surface of the protective film, at least two locations on the wafer 18 are irradiated with light to acquire spectra of the reflected light, and a unit that determines the uniformity in the wafer surface of the protective film is provided. For example, as shown in FIG. 5(A), the spectra of the reflected light can be acquired at at least two locations including a central portion X0 and a wafer edge Xn of the wafer 18.

Here, intensity of the reflection spectra varies depending on outputs of the light sources 56 and temporal change of the optical system 38. In a case where windows 62 made of quartz or the like that transmits light are used when the light from the light sources 56 is introduced into the processing chamber 31, surface states of the windows 62 are changed by the plasma and the like generated in the processing chamber 31, and the spectra of the incident light 57 and the reflected light (interference light) 58 may be affected.

In order to calibrate variations, reference spectra are acquired before the plasma processing (S301). First, a reference wafer is introduced into the processing chamber 31, and the incident light 57 generated from the light sources 56 is introduced into the processing chamber 31 through the windows 62 for light transmission, and is emitted onto the reference wafer. Then, the reflected light (interference light) 58 passes through the windows 62 again and is detected by the detectors 59.

The light detected by the detectors 59 moves through the optical fibers 60 and is dispersed by the spectroscopes 61. The reflection spectra dispersed by the spectroscopes 61 are stored in the database 49 as reference spectra. At this time, reference spectra are acquired for each measurement point for acquiring the distribution in the wafer. For example, as shown in FIGS. 5(A) to 5(D), in a case where the distribution in the wafer is measured at the wafer central portion X0 and the wafer edge Xn, the measurement is performed at the wafer central portion X0 and the wafer edge Xn on the reference wafer.

Next, initial distribution in the wafer surface of reflection spectra is measured by the optical system 38 for the groove pattern 13 and the etching target pattern 10 formed on the wafer 18 for etching (S302). Once initial variation calibrating spectra of the groove pattern 13 and the etching target pattern 10 of the wafer 18 for etching stored in the database 49 in the same manner as the reference spectra is acquired, the acquired initial reflection spectra of the etching wafer starts the protective film deposition step (S303).

First, the protective film forming gas 34 is supplied to the processing chamber 31 at a predetermined flow rate based on the control signal 54 from the apparatus control unit 42. The supplied protective film forming gas 34 becomes plasma by the radio frequency power 52 applied to the radio frequency application unit 41, and is decomposed into radicals, ions, and the like.

The pressure in the processing chamber 31 during the period can be kept constant in a state in which the processing gas having the desired flow rate is allowed to flow by the variable conductance valve and the vacuum pump. The radicals and ions generated by the plasma reach the surface of the wafer 18 and form the protective film 20 shown in FIGS. 6(A) and 6(B).

For example, SiO2, Si, SiN, C, fluorocarbon polymer, BCl, BN, BO, BC or the like can be deposited as a material of the protective film to be deposited.

In a case where, for example, SiO2 is deposited as the protective film, a mixed gas including a Si-based gas such as SiF4 or SiCl4, a gas such as O2, CO2 or N2, Ar, He or the like is used as the gas. In a case where Si is deposited as the protective film, for example, a mixed gas including a Si-based gas such as SiH4, SiF4 or SiCl4, a gas such as H2, NH3 or CH3, Ar, He or the like is used. In a case where SiN is deposited as the protective film, for example, a mixed gas including a Si-based gas such as SiF4 or SiCl4, a gas such as N2 or NF3, H2, Ar, He or the like is used as the gas.

In the case of depositing a C-based polymer or a CF-based polymer as a protective film, a mixed gas including fluorocarbon gas, hydrofluorocarbon gas, a rare gas such as Ar, He, Ne, Kr, or Xe, O2, CO2, CF4, N2, H2, anhydrous HF, CH4, CHF3, NF3, SF6 or the like is used.

In a case where BCl, BN, BO, BC or the like is deposited as the protective film, a mixed gas including BCl3 or the like, a rare gas such as Ar, He, Ne, Kr or Xe, Cl2, O2, CO2, CF4, N2, H2, anhydrous HF, CH4, CHF3, NF3, SF3 or the like is used.

Different materials can be deposited as the film to be deposited corresponding to the materials of the non-etching layer 14 at the lower layer and the etching target layer 11 at the lower layer.

Figure 5B:
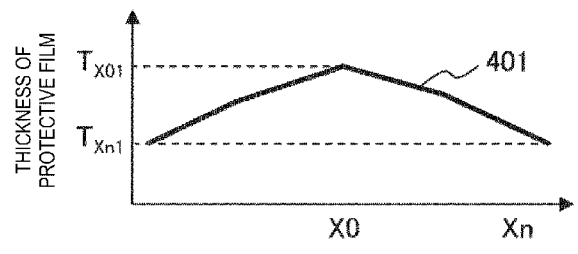

An example of the distribution in the wafer surface 401 of the thickness of the protective film 20 after the protective film deposition step (S303) is shown in FIG. 5(B). In the distribution in the wafer surface 401, the thickness of the protective film 20 at the wafer central portion X0 is formed to be thicker than the thickness of the protective film 20 at the wafer edge Xn.

In FIG. 6(A), cross-sectional views of the pattern at the positions of the wafer center portion X0 and the wafer edge Xn are shown. For example, at the position of the central portion X0 of the wafer, a thickness TX01 of the protective film 20 deposited on the upper surface 12 of the groove pattern 13 is larger than a thickness TXn0 of the protective film 20 deposited on the upper surface 12 of the groove pattern 13 at the wafer edge Xn. At this time, a width DX01 of the protective film 20 at the central portion X0 of the wafer is larger than a width WX01 of the groove pattern 13.

Similarly, a width DXn1 of the protective film 20 at the wafer edge Xn is larger than a width WXn1 of the groove pattern 13. The width DX01 of the protective film 20 at the wafer central portion X0 is larger than the width DXn1 of the protective film 20 at the wafer edge Xn.

After the protective film is formed, the distribution in the wafer surface of the reflection spectra is acquired (S304). The reflection spectra at the wafer positions X0 and Xn are acquired, and the information is transmitted to the film thickness calculation unit 48 in the film thickness control unit 47. Regarding the reflection spectrum information transmitted to the film thickness calculation unit 48, the intensity of the spectra is normalized by information of the reference spectra acquired in step 1.

Further, a thickness T of the protective film 20 and a pattern width W of the protective film 20 are calculated by spectrum fitting from the reflection spectra from the reference pattern stored in advance in the database 49. Then, the distribution in the wafer is calculated from T and W at the measurement positions set at two or more locations in the wafer. This distribution data can also be regarded as distribution data of an etch rate in the wafer surface.

Figure 7A:
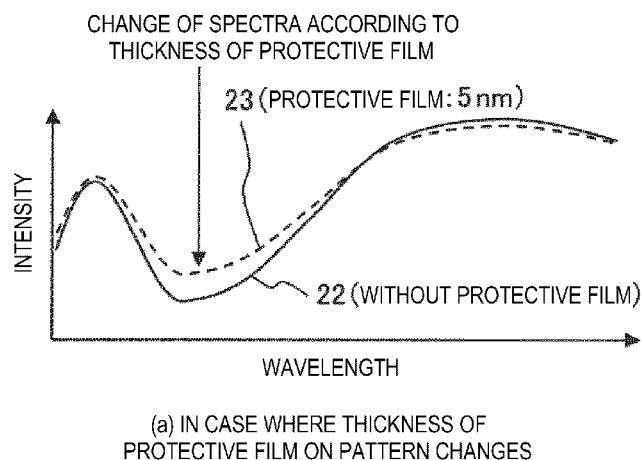
FIGS. 7(A) and 7(B) are explanatory diagrams of an example of a method for determining uniformity in the wafer surface of a protective film according to the embodiment.
Figure 7B:
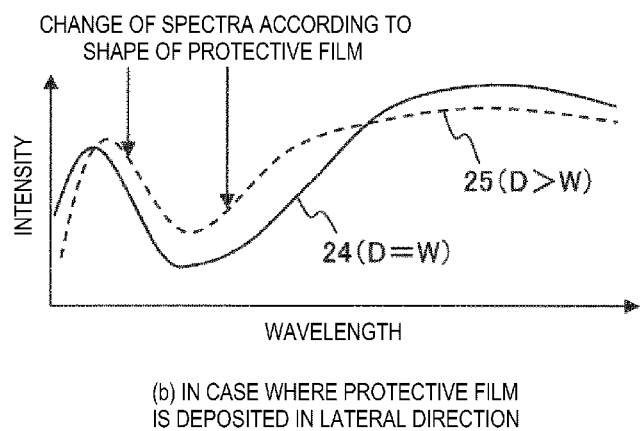

Accordingly, the distribution in the wafer surface of the protective film 20 can be easily evaluated. FIGS. 7(A) and 7(B) show an example of change of the reflection spectra according to the cross-sectional shape of the protective film. FIG. 7A shows a reflection spectrum 22 from the groove pattern 13 before the protective film 20 is deposited and a reflection spectrum 23 when, for example, a 5 nm-thick SiO2 film is deposited on the groove pattern 13 as an example of the change of the reflection spectra when the thickness of the protective film 20 changes.

Since the reflection spectra changes when the thickness of the protective film 20 changes, the distribution in the wafer surface of the change in the thickness of the protective film 20 can be evaluated by matching the spectra and the reflection spectra acquired in advance. Alternatively, the distribution in the wafer surface of the thickness of the protective film 20 can be evaluated by matching with the spectrum calculated using reflectance of the protective film 20 measured in advance.

FIG. 7B shows a reflection spectrum 24 when the width D of the protective film 20 is the same as the width W of the groove pattern 13 and a reflection spectrum 25 when the width D of the protective film 20 is larger than the width W of the groove pattern 13 when the 5 nm-thick SiO2 film is formed on the groove pattern 13 as an example in a case where the pattern width D of the protective film 20 changes.

Since after a thickness of the protective film forming step, the shape of the reflection spectrum changes when a size of the width D of the protective film 20 deposited on the groove pattern 13 changes, the distribution in the wafer surface of the change in the width D of the protective film 20 can be evaluated by matching the spectra and the reflection spectra acquired in advance. Further, the distribution in the wafer surface of the change in the width D of the protective film 20 can be evaluated by matching with the spectrum calculated using reflectance of the protective film 20 measured in advance.

Once the distribution in the wafer surface of the thickness T of the protective film 20 and the width W of the protective film 20 is calculated from the reflection spectra after the protective film deposition step, a condition for removing an excess deposit film having an etch rate distribution (removal condition) that alleviates the distribution in the wafer surface of the thickness T of the protective film 20 is searched from the distribution in the wafer surface of the etch rate stored in the database 49 in advance (S305).

Figure 5C:
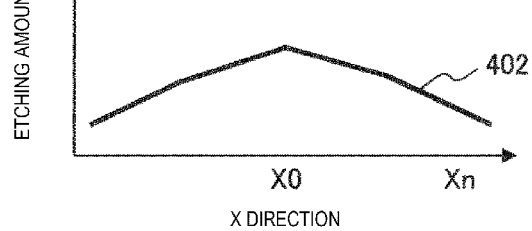

For example, processing conditions are set such that a distribution in the wafer surface 402 of an etching amount in the excess deposited object removing step becomes an etch rate distribution as shown in FIG. 5(C). First, a gas type is determined by a film type of the protective film and the non-etching layer 14 at the lower layer.

First, in the case where the width D of the measured protective film 20 is larger than the width W0 of the target groove pattern 13, for example, a condition for removing a part of the protective film is determined when a wafer bias is equal to or more than V0. The wafer bias V0 is determined from the type of the protective film 20 and the thickness of the protective film 20.

Further, time tx at which the width D of the protective film 20 becomes a target value W0 is calculated from a time dependency database of the width D of the protective film 20 in the case of the wafer bias V0 stored in the database 49 in advance, and the distribution in the wafer surface of the thickness of the protective film 20 at this time is calculated.

Further, a condition for removing an excess deposited object having an etch rate in-surface distribution that alleviates the distribution in the wafer surface of the thickness of the protective film 20 is searched from the distribution in the wafer surface of the etch rate stored in the database 49 in advance.

Figure 8A:
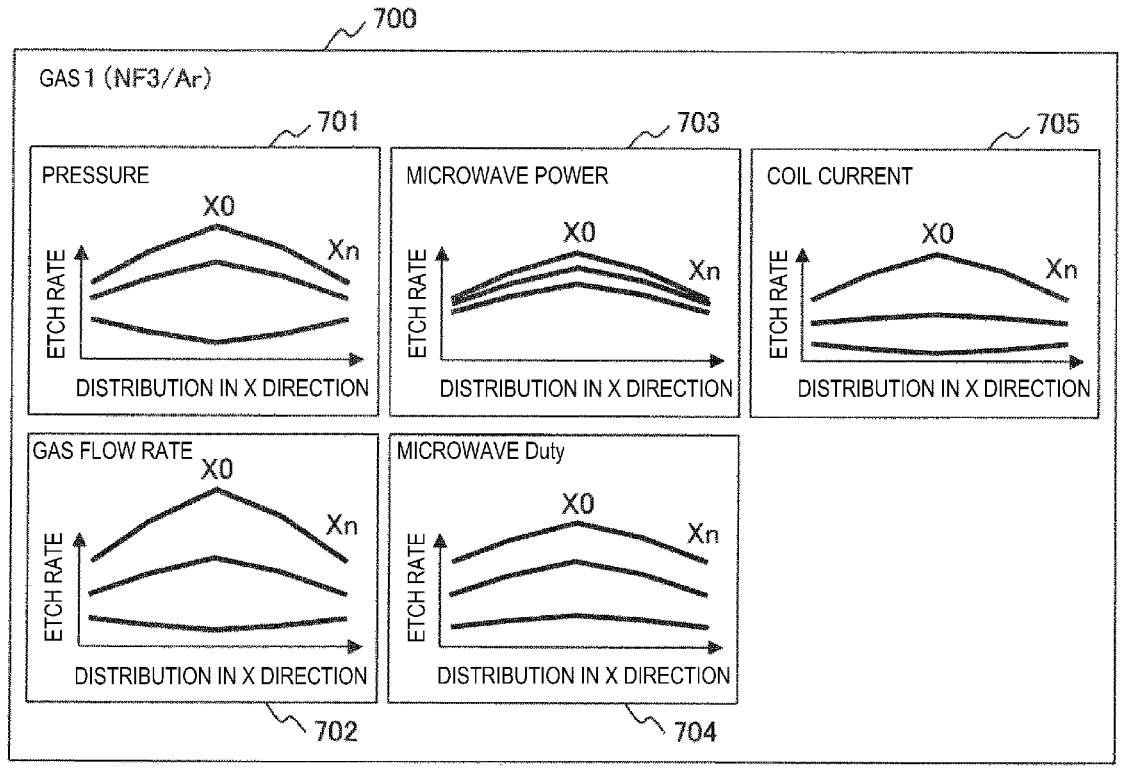
FIGS. 8(A) and 8(B) are explanatory diagrams of an example of a reference database according to the embodiment.

As an example, FIG. 8(A) shows a protective film thickness distribution control database 700. Conditions for obtaining a desired etching distribution can be searched for and an optimal condition can be determined by the film thickness distribution control database including the distribution in the wafer surface of the etch rate relating to, mainly, gas pressure 701, gas flow rate 702, microwave power 703, microwave Duty 704 and coil current 705 as processing conditions of the excess deposited object removing step.

Figure 8B:
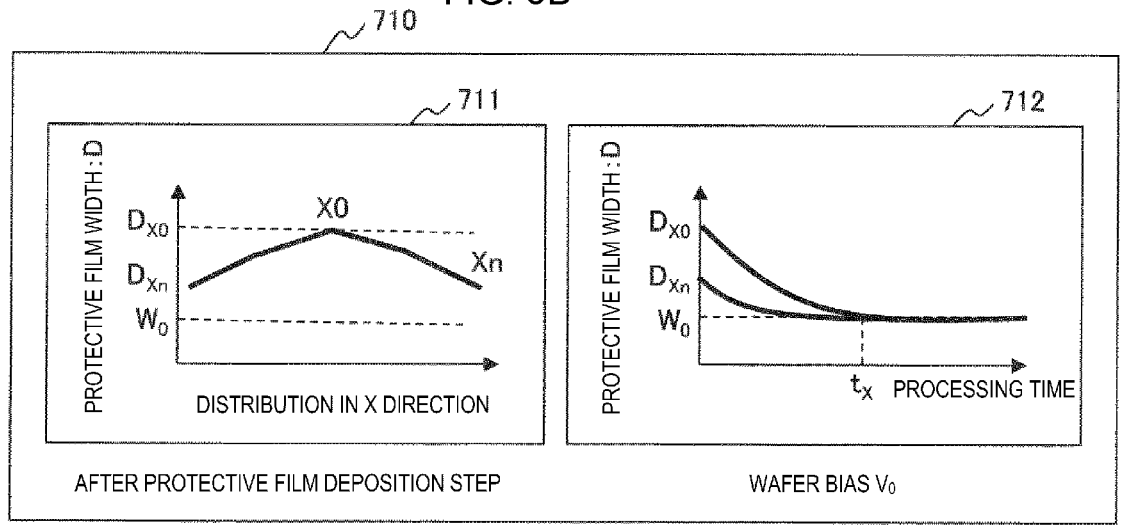

FIG. 8(B) shows an example of a control database 710 of the width D of the protective film 20. In order to uniform a distribution 711 of the width D of the protective film 20, for example, a wafer bias voltage 712 and a Duty ratio (not shown) can be determined such that the width D of the protective film 20 becomes uniform at a desired etching time.

Once the etching conditions to remove the excess deposited object is determined, the excess deposited object removing step is implemented (S306). When the excess deposited object removing step (S306) is started, the excess deposited object removing gas 35 is supplied to the processing chamber 31 at the predetermined flow rate. The supplied excess deposited object removing gas 35 becomes plasma by the radio frequency power 52 applied to the radio frequency application unit 41, and is decomposed into ions or radicals, and is emitted onto the surface of the wafer 18.

At this time, in a case where etching is performed by ions emitted from the plasma, for example, a bias voltage 53 supplied from the bias power supply 40 to the wafer stage 32 can be applied to control the ion energy to perform etching by the reactive ion assist for correcting the non-uniformity of the protective film 20.

Figure 5D:
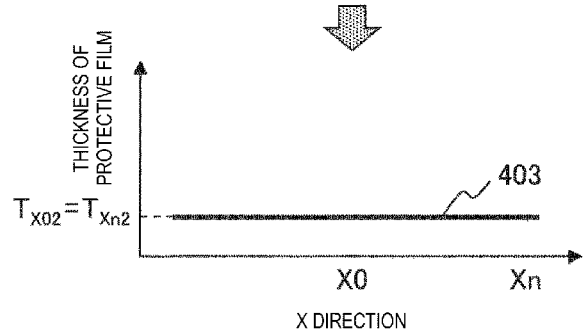

An example of a distribution in the wafer surface 403 of the thickness of the protective film 20 after the excess deposited object removing step is implemented is shown in FIG. 5(D). An example of the cross-sectional shape of the pattern at the positions X0 and Xn in the wafer is shown in FIG. 6(B). The distribution in the wafer surface 403 of the thickness of the protective film 20 is uniformed by the excess deposited object removing step, and the widths Dx02 and Dxn2 of the protective film 20 are equal to each other in the in-surface distribution of the cross-sectional shape, and the uniformed protective film 20 is formed in the wafer surface.

Once the excessive deposit removing step (S306) is ended, the reflection spectra at the wafer positions X0 and Xn are acquired for determining whether the distribution in the wafer surface of the protective film 20 is within a predetermined range. For example, the reflection spectra at the positions X0 and Xn in the wafer shown in FIGS. 5(A) to 5(D) are acquired, and the information is transmitted to the film thickness calculation unit 48 in the film thickness control unit 47.

Next, the distribution in the wafer surface of the change in the width D of the protective film 20 is evaluated by matching the acquired reflection spectra with the spectrum calculated using the reflectance of the protective film 20 measured in advance. Whether the distribution in the wafer surface is within the predetermined range is determined from the matching and an error in the matching (S307). In a case where the reflection spectra acquired at different positions coincide with a variation within a specified value, it can be determined that the uniform protective film 20 is formed in the wafer surface (Yes in S307).

In a case where the matching error of the reflection spectra is equal to or more than the specified value (No in S307), the distribution in the wafer surface of the thickness of the protective film 20 is evaluated from the acquired reflection spectra. Further, the distribution in the wafer surface of the change in width D of the protective film 20 is evaluated by matching with the spectrum calculated using reflectance of the protective film 20 measured in advance (S310).

As a result of evaluating the distribution in the wafer surface of the thickness of the protective film 20 and the distribution in the wafer surface of the change of the width W of the protective film 20 in S310, in a case where the removal of the excessive deposit is not sufficient, $T_x0>T_{xn}$ after the protective film deposition step, and $T_x0>T_{xn}$ after an excessive deposition process, the processing returns to S305 to search for a removing condition capable of canceling the distribution in the wafer surface of the protective film 20 in the excess deposited object removing step for eliminating the distribution in the wafer surface of the protective film 20 and executes the excessive deposit removing step (S306) again.

On the other hand, in a case where $T_x0>T_{xn}$ after the protective film deposition step, and $T_x0>T_{xn}$ after the excessive deposit removing step, the processing returns to the protective film deposition step (S303). The above is repeated until an inside of the wafer surface becomes uniform.

In a case where it is determined in step S310 that the removal of the excessive deposit is not sufficient and the processing is returned to S305, since the thickness of the protective film 20 is small, a next condition for eliminating the distribution in the wafer surface in the excess deposited object removing step (S306) based on the case may not be able to be searched. Therefore, in a case where the thickness of the protective film 20 is checked (S311) and the thickness of the protective film 20 is insufficient (a case of No in S311), the processing returns to S302, returns to the protective film deposition step (S303) after acquiring the reference reflection spectra, and starts again from the deposition step of the protective film 20.

In a case where it is determined that the matching error of the reflection spectra from the positions X0 and Xn in the wafer is within the predetermined range, and the uniform protective film 20 is formed in the wafer surface in S307 (Yes in step S307), the same reflection spectrum is further compared with reference data stored in advance in the database 49, the thickness of the protective film 20 and the width of the protective film 20 are calculated, and whether the predetermined film thickness has been reached is determined (S308).

In a case where the calculated thickness is not the predetermined film thickness (a case of No in S308), the processing returns to the protective film deposition step (S303) and is repeated until the predetermined film thickness is reached.

Here, even if the protective film deposition step (S303) and the excessive deposit removing step (S306) are repeatedly implemented, the formed thickness of the protective film may not increase. FIG. 9 shows an example of an evaluation result of the change in the thickness of the protective film for each cycle in the case where the protective film deposition step (S303) and the excessive deposit removing step (S306) are implemented repeatedly. Accordingly, even when the number of cycles is increased to form the protective film repeatedly, the thickness of the protective film may not be increased due to saturation.

It is clear that a reason for the above is, by repeating the protective film deposition (S303) and the excess deposited object removing (S306), the deposited object adheres in the processing chamber 3, a component for removing the protective film is released into the plasma during the protective film deposition (S303), and the protective film cannot be deposited on the wafer.

Therefore, as shown FIG. 4, after acquiring the reflection spectra (S307), a step of determining whether the thickness of the protective film is saturated from a change amount of the reflection spectra (S312) is implemented, and in a case where the thickness of the protective film is saturated, a step of implementing cleaning processing in the processing chamber 3 is provided (S313).

FIG. 4 shows another example of a process flow of forming a protective film by repeating the protective film deposition step (S303) and the excess deposited object removing (S306). In a case where the thickness of the protective film is not expected to increase even after the protective film deposition step (S303) and the excess deposited object removing (S306) are repeated and the thickness of the protective film is determined to be saturated (a case of Yes in S312), the wafer is removed from the processing chamber 31, and the cleaning processing for removing deposited objects adhered to the inner wall of the processing chamber 31 is implemented (S313).

As a gas for performing the cleaning processing, for example, in a case where the deposited protective film is SiO2, Si, Sin, or C-based films, a mixed gas including a gas containing F such as SF6 and NF3, O2, H2, N2, Ar, He or the like is used. In a case where the deposited protective film is BCl, BN, BO, BC or the like, a mixed gas including BCl3, CL2, O2, CO2, CF4, N2, H2, or the like is used.

During the cleaning processing, light emission from the plasma in the processing chamber is acquired. An end of the cleaning in the processing chamber can be determined, for example, by monitoring light emission of a substance generated from the deposited object and measuring the light emission generated from the deposited object. For example, in a case where a protective film containing Si is deposited, a signal of a wavelength of light emission from SiFx is monitored, and when the signal is equal to or less than a specified value, the cleaning is ended. For example, in a case where a protective film containing C is deposited, light emission from COx is monitored, and when a signal is equal to or less than the specified value, the cleaning is ended. For example, in a case where a protective film containing B is deposited, light emission from $BCl_x$ or $BF_x$ is monitored, and when a signal is equal to or less than the specified value, the cleaning is ended.

Alternatively, when the protective film is deposited on the wafer, the protective film is simultaneously deposited on a sample for signal acquisition, and a reflection spectrum from the sample for signal acquisition is acquired. After the cleaning, the reflection spectrum is acquired again, and in a case where the spectrum coincides with an initial spectrum without the protective film, the cleaning can be ended. Once the cleaning in the processing chamber is ended, a reference reflection spectrum is acquired before a next protective film deposition step (S301).

Although FIG. 9 describes a case where the protective film deposition (S303) and the excess deposited object removing (S306) are implemented on one wafer and the thickness of the protective film is saturated, even if the thickness of the protective film can be formed to a desired thickness in a case where one wafer is processed, a protective film having a desired thickness may not be formed in a mass production process when a large number of wafers are processed during a long period of time.

FIG. 10 shows a transition in the thickness of the protective film deposited per cycle in a case where a large number of wafers were subsequently processed. As shown in FIG. 10, when many wafers are processed, the thickness of the protective film that can be deposited per cycle may gradually become small. In such a case, the reflection spectrum is acquired (S307), the thickness of the protective film deposited per cycle is determined to be equal to or less than a specified value (S312), and a function of performing cleaning of the processing chamber 31 is provided (S313).

Whether the thickness of the protective film deposited per cycle is equal to or less than the specified value is determined by a change amount from the reflection spectrum acquired one cycle before (S312). Accordingly, by acquiring the transition of the deposit film thickness per cycle and implementing the cleaning when the film thickness is equal to or less than the specified value, the deposit film thickness can be recovered per cycle and the protective film can be formed stably fora long period of time.

In a case where the thickness of the protective film reaches a predetermined film thickness by implementing the processing described above (a case of No in S308 in FIGS. 3 and 4), the protective film forming step ends, and the lower layer etching step is started using the formed protective film 20 as the mask (S309).

In the lower layer etching step (S309), first, the gas supply unit 33 is controlled by the apparatus control unit 42 to supply the etching gas 36 to the processing chamber 31 at a predetermined flow rate. When the etching gas 36 is supplied and the inside of the processing chamber 31 reaches a predetermined pressure, the radio frequency power supply 37 is controlled by the apparatus control unit 42, and the radio frequency power 52 is applied to the radio frequency application unit 41 to generate the plasma by the etching gas 36 inside the processing chamber 31.

The etching processing of the wafer 18 on which the protective film 20 is formed is performed by the plasma of the etching gas 36 generated inside the processing chamber 31. While the etching process is performed, the thickness of the protective film 20 is measured by the optical system 38, the thickness of the protective film 20 is measured until the pattern on the wafer is etched to a desired depth. The etching is ended when a predetermined etching processing time or a desired depth is reached.

Here, the thickness of the protective film 20 may be equal to or less than the specified value before reaching the desired etching depth. In such a case (NO in S310), the process returns to the protective film deposition step (S303), the deposition step of the protective film 20 starts again, and the protective film deposition is implemented again until the predetermined film thickness is reached. Further, by executing the excessive deposit removing step (S306), the protective film 20 having a uniform film thickness and a film width in the wafer surface is formed.

As described above, steps S303 to S310 are repeated until the pattern on the wafer 18 on which the protective film 20 is formed is etched to a predetermined depth. In step S310, the etching is ended when the etching depth reaches the predetermined depth. Further, after etching the pattern, the protective film deposited on the pattern surface can be removed. It is possible to remove the protective film only, or the protective film remaining on a mask surface may be removed simultaneously with a mask material in a case where the protective film is formed on the mask material.

By applying such a plasma processing to the wafer 18, the problem of the related art that the upper surface 12 of the groove pattern 13 is etched and a depth of the pattern is reduced, and the problem that the mask pattern is etched during the etching of etching target layer 11 at the lower layer and the etching proceeds up to the upper surface 12 of the groove pattern 13 are solved. As shown in FIG. 11, a desired etching shape can be obtained.

In the embodiment described above, in a case where the non-etching layer 14 and the etching target layer 11 at the lower layer are formed as the etching target pattern 10, and no mask is formed on the upper surface 12 of the groove pattern 13, a method of forming the uniform protective film 20 on the upper surface 12 of the groove pattern 13 in the wafer surface is described for a case where only the etching target layer 11 at the lower layer of the etching target pattern 10 is etched.

Figure 12A:
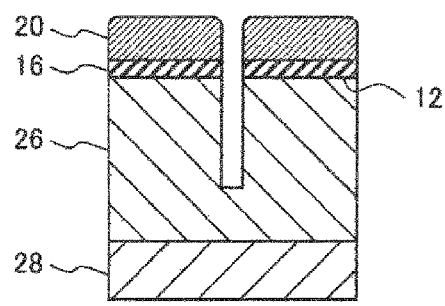
FIGS. 12(A) to 12(C) are explanatory diagrams of an example of another pattern to which the invention is applied.
Figure 12B:
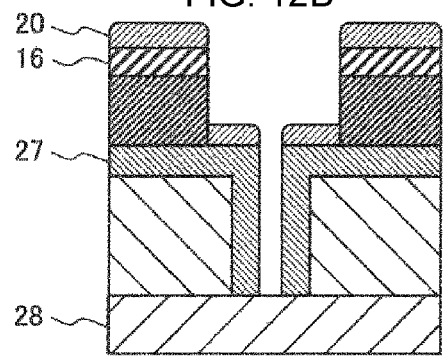
Figure 12C:
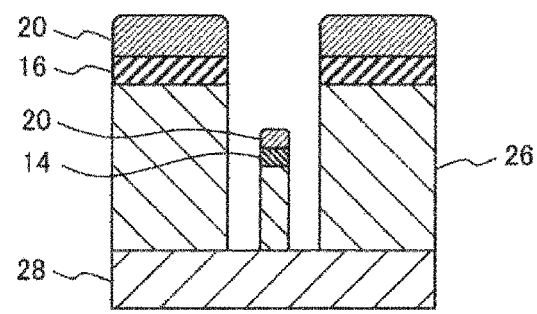

In FIGS. 12(A) to 12(c), other examples of a pattern that may be etched using a protective film forming method of the embodiment are shown. In FIG. 12(A), a mask 16 is formed on an etching target layer 26 formed on an underlayer 28. In a case where the etching target layer 26 is etched with a high aspect ratio when the mask 16 is thin, a desired pattern can be processed without etching the upper surface 12 of the groove pattern 13 by forming the uniform protective film 20 on the mask 16.

FIG. 12(B) shows a case where a non-etching layer as a stopper layer 27 is formed under a groove of a pattern formed by the mask 16, and an etching target layer at a lower layer is etched. In the case, by forming the uniform protective film 20 on the mask 16 and the stopper layer 27, a pattern having a complex shape having a step difference can be processed.

In FIG. 12(C), a case where a fine convex pattern is formed in a groove of a pattern formed by the mask 16 is described. In a case where the etching target layer 26 is etched up to the underlayer 28 without etching the non-etching layer 14 on an upper surface of the convex pattern, by forming the uniform protective film 20 on the mask 16 and the non-etching layer 14, a pattern having a complex shape having a step difference can be processed.

According to the present embodiment, by etching the wafer in a state where the protective film is formed uniformly in the wafer surface by removing excess deposited object on an upper portion of the pattern formed on the wafer, the problem of the related art that the upper surface of the pattern is etched and a depth of the pattern is reduced, and the problem that the mask pattern is etched during the etching of material at the lower layer and the etching proceeds up to the upper surface of the groove pattern can be solved, and a desired etching shape can be obtained.

As described above, although the invention has been described in detail based on the embodiment, the invention is not limited to the above-described embodiment and various changes can be made within the scope not departing from the gist of the invention. For example, the embodiment described above has been described in detail for easy understanding of the invention, and the invention is not necessarily limited to those including all of the configurations described above. In addition, apart of the configuration of each embodiment may be added, deleted, or replaced with another configuration.

REFERENCE SIGN LIST 10 etching target pattern
11 etching target layer
12 upper surface of groove pattern
13 groove pattern
14 non-etching layer
15 underlayer
16 mask
17 etching depth
18 wafer
20 protective film
26 etching target layer
27 stopper layer
28 underlayer
30 etching apparatus
31 processing chamber
32 wafer stage
33 gas supply unit
34 protective film forming gas
35 excess deposited object removing gas
36 etching gas
37 radio frequency power supply
38 optical system
39 optical system control unit
40 bias power supply
41 radio frequency application unit
42 apparatus control unit
43 gas control unit
44 exhaust system control unit
45 radio frequency control unit
46 bias control unit
47 film thickness and film width control unit
48 film thickness and film width calculation unit
49 database
50 storage unit
51 clock
56 light source
59 detector
60 optical fiber
61 spectroscope
62 window

The invention claimed is:

1. A plasma processing method for plasma etching an etching target film formed on a sample, the method comprising:
a protective film forming step of selectively forming a protective film on an upper portion of a pattern formed on the sample, comprising
monitoring spectra of interference light reflected from the sample on which the protective film is formed;
adjusting a width of the formed protective film such that a distribution of the width of the formed protective film in a surface of the sample becomes a desired distribution, and based on a comparison result between a pattern of spectra of interference light reflected from the sample,
wherein, in a cross-section view, a first thickness of the protective film formed at a central portion of the sample is larger than a second thickness of the protective film formed at an edge of the sample, and
wherein a pattern of the monitored spectra of the interference light when the distribution of the width of the protective film in the surface of the sample is the desired distribution; and
a step of plasma etching the etching target film after the protective film forming step.

2. The plasma processing method according to claim 1, wherein
the protective film forming step further adjusts a thickness of the formed protective film based on a comparison result between the pattern of the spectra of the interference light reflected from the sample on which the protective film is formed and the pattern of the monitored spectra of the interference light when a distribution of the thickness of the protective film in the surface of the sample of the etching target film is a desired distribution.

3. The plasma processing method according to claim 1, wherein
the pattern is a pattern of a groove, and
the etching target film is embedded in the groove.

4. The plasma processing method according to claim 1, wherein
the pattern formed on the sample in which the protective film is selectively formed on the upper portion is a groove pattern, and
the etching target film is embedded in the groove.

5. The plasma processing method according to claim 1, wherein
the desired distribution is a uniform distribution in the surface of the sample.

6. The plasma processing method according to claim 1, wherein
the etching target film is plasma etched to a desired depth by repeating the protective film forming step and the step of plasma etching the etching target film.

7. The plasma processing method according to claim 1, wherein
the protective film forming step further adjusts a thickness of the protective film such that a distribution of the thickness of the protective film in the surface of the sample is a desired distribution.

8. The plasma processing method according to claim 7, wherein
when the thickness of the protective film is saturated, a plasma etching processing chamber in which the etching target film is plasma etched is plasma cleaned.

9. A plasma processing apparatus comprising:
a processing chamber where an etching target film formed on a sample is plasma etched using mask;
a radio frequency power supply that supplies radio frequency power for generating the plasma;
a sample stage on which the sample is placed; and
a control unit that executes a protective film forming step of selectively forming a protective film on an upper portion of a pattern formed on the sample, comprising
monitoring spectra of interference light reflected from the sample on which the protective film is formed;
adjusting a width of the formed protective film such that a distribution of the width of the formed protective film in a surface of the sample becomes a desired distribution, and based on a comparison result between a pattern of spectra of interference light reflected from the sample; and
etching the etching target film after the protective film forming step
wherein, in a cross-section view, a first thickness of the protective film formed at a central portion of the sample is larger than a second thickness of the protective film formed at an edge of the sample, and
wherein a pattern of the monitored spectra of the interference light when the distribution of the width of the protective film in the surface of the sample is the desired distribution.

* * * * *